United States Patent
Hasegawa et al.

(10) Patent No.: US 8,547,631 B2
(45) Date of Patent: Oct. 1, 2013

(54) SEMICONDUCTOR OPTICAL AMPLIFIER

(75) Inventors: Hideaki Hasegawa, Tokyo (JP); Masaki Funabashi, Tokyo (JP); Noriyuki Yokouchi, Tokyo (JP); Junji Yoshida, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 627 days.

(21) Appl. No.: 12/708,043

(22) Filed: Feb. 18, 2010

(65) Prior Publication Data

US 2010/0245987 A1    Sep. 30, 2010

(30) Foreign Application Priority Data

Mar. 26, 2009  (JP) ................. 2009-077447

(51) Int. Cl.
*H01S 5/50* (2006.01)
*H01S 5/20* (2006.01)

(52) U.S. Cl.
USPC ...................................... 359/344; 372/45.01

(58) Field of Classification Search
USPC .............................. 359/344; 372/50.22, 45.01
See application file for complete search history.

(56) References Cited

U.S. PATENT DOCUMENTS

| | | | |
|---|---|---|---|
| 5,436,759 A * | 7/1995 | Dijaili et al. ................... | 359/333 |
| 5,488,507 A * | 1/1996 | Nishimura ..................... | 359/344 |
| 6,356,382 B1 * | 3/2002 | Nakano et al. ................. | 359/332 |
| 6,614,822 B2 * | 9/2003 | Yoshida et al. ............ | 372/45.01 |
| 7,045,374 B2 * | 5/2006 | Lee et al. .......................... | 438/31 |
| 7,095,938 B2 * | 8/2006 | Tolstikhin ...................... | 385/131 |
| 2004/0135136 A1 * | 7/2004 | Takahashi et al. .............. | 257/14 |
| 2007/0216996 A1 * | 9/2007 | Tanaka et al. .................. | 359/344 |
| 2008/0310012 A1 * | 12/2008 | Tanaka et al. ................ | 359/344 |
| 2009/0237780 A1 * | 9/2009 | Tanaka .......................... | 359/344 |

FOREIGN PATENT DOCUMENTS

| | | |
|---|---|---|
| JP | 01-282883 | 11/1989 |
| JP | 04-033380 | 2/1992 |
| JP | 04-234189 | 8/1992 |
| JP | 2005-050898 | 2/2005 |

OTHER PUBLICATIONS

Ken Morito, et al., "A Broad-Band MQW Semiconductor Optical Amplifier With High Saturation Output Power and Low Noise Figure", IEEE Photonics Technology Letters, vol. 17, No. 5, May 2005, 3 pages.

Japanese Office Action mailed Feb. 19, 2013 for Japanese Patent Application No. 2009-077447, 2 pages.

* cited by examiner

*Primary Examiner* — Eric Bolda
(74) *Attorney, Agent, or Firm* — Turocy & Watson, LLP (57) ABSTRACT

It is desirable to provide a semiconductor optical amplifier from which it becomes able to obtain a higher output power. A semiconductor optical amplifier in comprises an active wave guiding layer which comprises a passive core region that is formed of a semiconductor, and active cladding regions that are located at both sides of the passive core region and each of that is comprised of an active layer which is formed of a semiconductor and which has an index of refraction to be lower than that of the passive core region, wherein a light is wave guided with being amplified in the active wave guiding layer. Moreover, it is desirable for the active wave guiding layer to be formed of a compound semiconductor, and to be formed by integrating the passive core region and the active cladding regions to be monolithic on to a substrate that is formed of a compound semiconductor by making use of a process of a butt joint growth.

8 Claims, 9 Drawing Sheets

SEMICONDUCTOR OPTICAL AMPLIFIER

CROSS-REFERENCE TO RELATED APPLICATIONS

This application claims priority to Japanese patent application Serial No. 2009-77447, filed on Mar. 26, 2009, the entire content of which is incorporated herein by reference.

TECHNICAL FIELD

The present invention relates to a semiconductor optical amplifier.

BACKGROUND ART

Regarding an optical communication it becomes extremely important to make use of an optical amplifier that generates a noise to be lower and that brings a gain to be higher in order to perform a compensation of a transmission loss in an optical fiber or of an insertion loss of an optical component, such as an arrayed waveguide grating (AWG) or the like. And then a semiconductor optical amplifier (SOA) as an electric current excitation type is the optical amplifier which is smaller in package and at a low price as well, because it is not necessary for the same to make use of a pump laser, that is different from an Er-doped fiber amplifier (EDFA). And then in recent years in particular, a semiconductor optical amplifier is paid attention extremely because the same has a property of which is smaller in package, from a point of view of such as that it is possible to integrate to be a fine optical circuit, such as the AWG or the like. Moreover, at the beginning of the development of the semiconductor optical amplifier the same is inferior in the properties of a saturation power output and a noise figure (NF) with comparing to each of that of the EDFA respectively. However, the development has been progressed in recent years, and then there becomes to be reported a semiconductor optical amplifier that has the property to be not inferior to that of the EDFA from the point of view of the saturation power output and the noise figure with comparing to each of that of the EDFA respectively (refer to the following nonpatent document 1).

Figure 8:
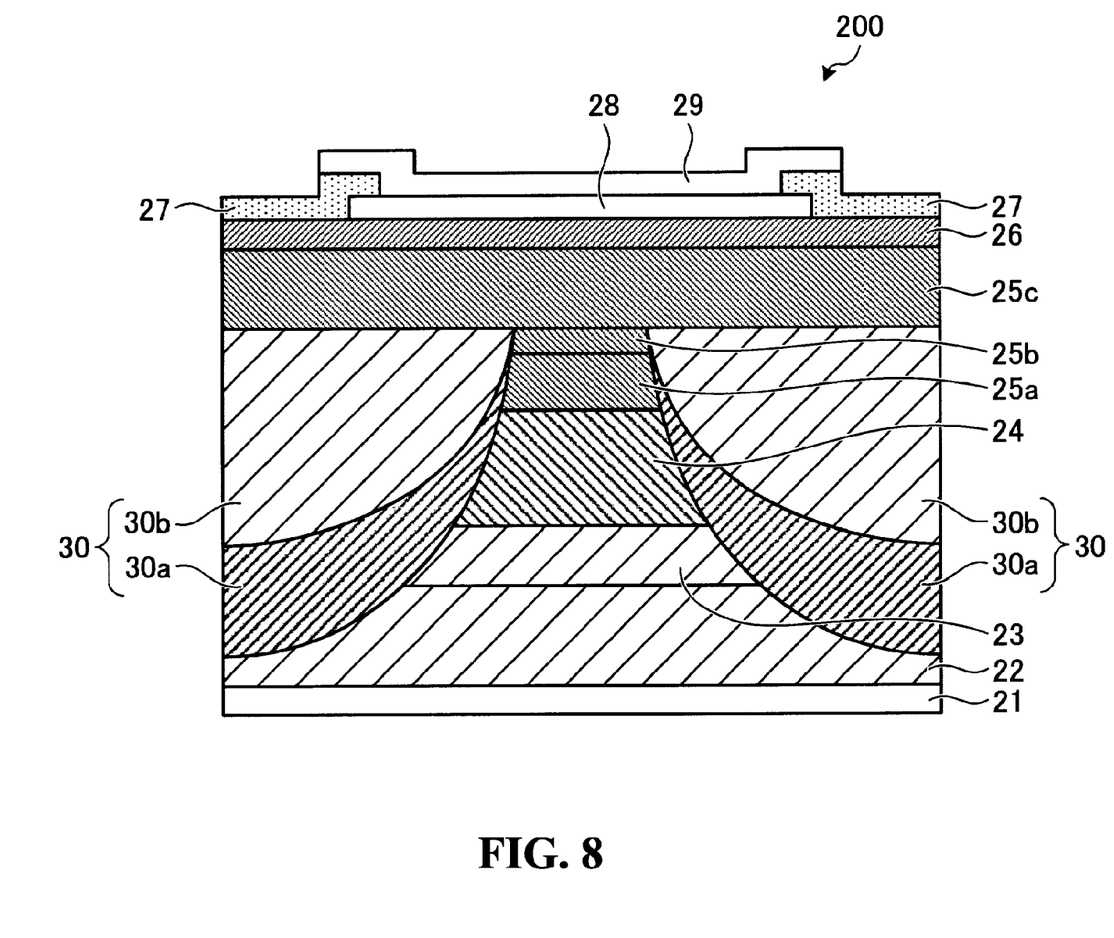
FIG. 8 is a cross sectional view exemplary showing one example of a structure of a conventional semiconductor optical amplifier.

Here, FIG. 8 is a cross sectional view for exemplary showing one example of a structure of a conventional semiconductor optical amplifier that functions as an optical amplifier. And then such a semiconductor optical amplifier (200) comprises a structure in which a cladding layer at a lower part (23) as an (n) type that functions as a buffer layer as well, an active layer (24) that is formed of a semiconductor and cladding layers at an upper part (25a) and (25b) as a (p) type for both are grown on a substrate (22) as an (n) type on which an electrode at an (n) side (21) is formed at a rear surface, that are shown in FIG. 8. Moreover, from a part of the substrate (22) to the cladding layers at the upper side as the (25a) and the (25b) becomes to be a mesa structure. And then both sides of the structure is implanted with making use of each of electric current blocking layers (30) and another (30) that individually are comprised of an electric current blocking layer at a lower part (30a) as a (p) type and an electric current blocking layer at an upper part (30b) as an (n) type, respectively. Further, a cladding layer at an upper part (25c) as a (p) type and a contact layer (26) as a (p) type are grown on the cladding layer at the upper part (25b) and to each of the electric current blocking layer as the (30) and the other (30). Still further, a protective coat film layer (27) and an electrode at a (p) side (28) are formed on the contact layer (26), and then an electrode at an outside (29) is formed thereon as well. Still further, in accordance with the semiconductor optical amplifier (200) two of end faces are formed in approximately parallel to the paper in a direction vertical to the paper. Furthermore, an anti-reflection coated film layer is formed on the two of the end faces.

And then the semiconductor optical amplifier (200) becomes to function as the following. In the first instance, a voltage is applied to between the electrode at the (n) side (21) and the electrode at the (p) side (28), and then an electric current is injected into the semiconductor active layer (24) so as to be an excited state. Moreover, the electric current is injected efficiently into the semiconductor active layer (24) by making use of the electric current blocking layer (30). And then after the semiconductor active layer (24) becoming the excited state in such a manner a light is input from one end face, that is to be performed an amplification, such as a light that has a wave length in a band of 1.55 μm or the like that is made use for the optical communication. And hence the light becomes to be amplified due to a function of a stimulated emission with being wave guided by making use of the semiconductor active layer (24). And then as a result a light that is amplified becomes to be output from the other end face.

Further, in accordance with the semiconductor optical amplifier (200) each of the end faces becomes to have a predetermined coefficient of reflection in a case where the anti-reflection coated film layer is not formed at the two of the end faces. And then therefore it is able to form an optical cavity as a Fabry-Perot type with making use of the two of the above mentioned end faces, and then it is able to make use of the device as a semiconductor laser equipment. Furthermore, it is able to make use of the semiconductor optical amplifier (200) as the semiconductor laser equipment in the same way even in a case where a reflection coated film layer is formed that has a desired coefficient of reflection in the place of the anti-reflection coated film layer.

[Non Patent Document 1] K. Morito et al., "A Broad-Band MQW Semiconductor Optical Amplifier With High Saturation Output Power and Low Noise Figure", IEEE Photonics Technol. Lett., Vol. 17, No. 5, pp. 974-976, May 2005.

DISCLOSURE OF THE INVENTION

Problems to be Solved by the Invention

In the meantime, it becomes important to reduce a confinement coefficient (Γ) to be smaller, and it becomes important to decrease an optical loss at an inner side as well, in order to obtain a property of which an output power is higher in accordance with a semiconductor optical amplifier. Here, the confinement coefficient (Γ) is defined as a rate of an intensity of a light that is confined in a semiconductor active layer against a whole of the intensity of the light that is to be wave guided.

And then in accordance with the semiconductor optical amplifier which has the conventional structure that is shown in FIG. 8 it is difficult to reduce the confinement coefficient (Γ) to be smaller, and it is difficult to decrease the optical loss either. A further explanation will be described in detail below.

Figure 9:
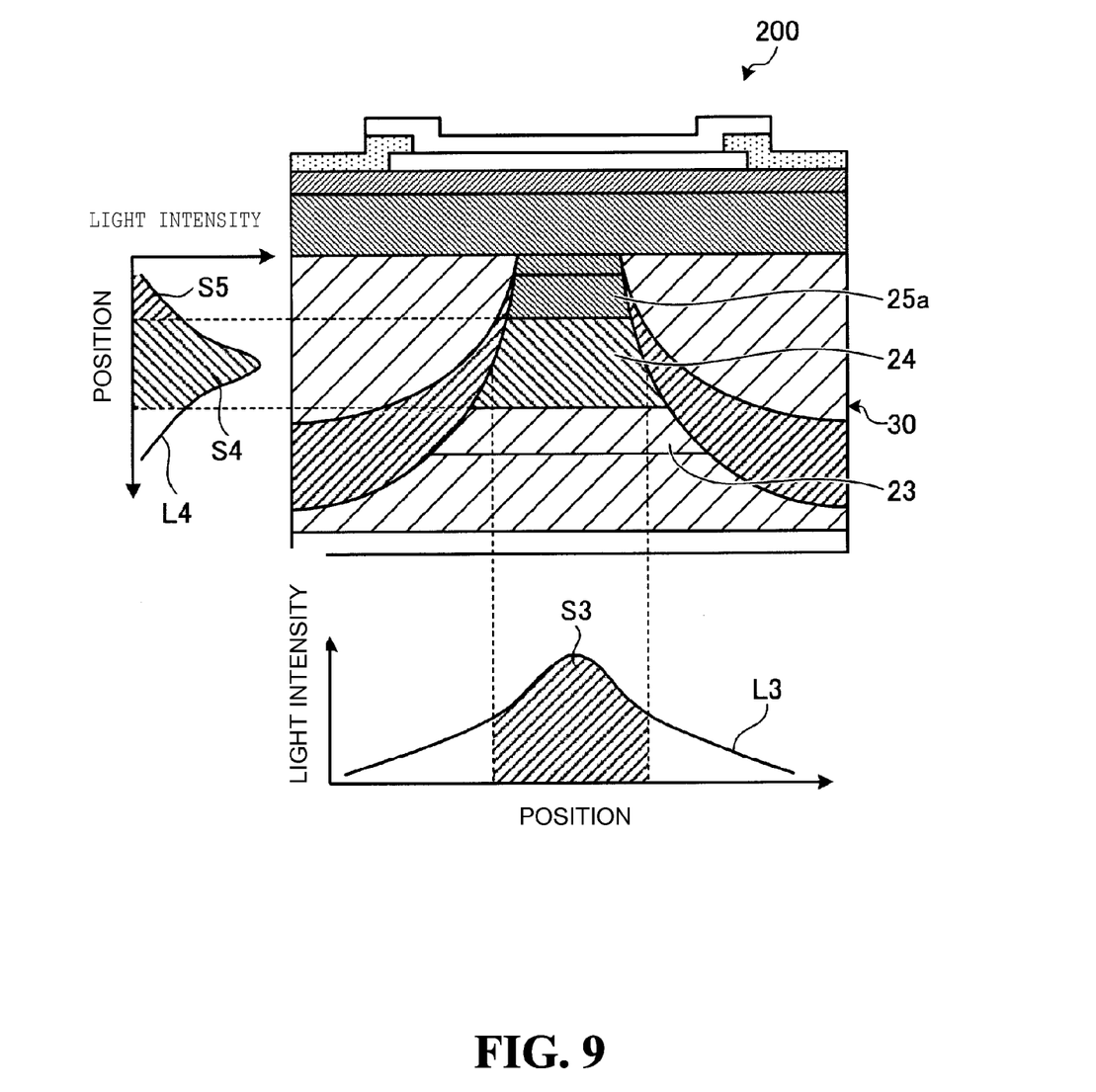
FIG. 9 is a view exemplary showing an intensity distribution of a light that is wave guided in the semiconductor optical amplifier which is shown in FIG. 8.

Here, FIG. 9 is a view for exemplary showing an intensity distribution of a light that is wave guided in the semiconductor optical amplifier (200) which is shown in FIG. 8. And then in accordance with FIG. 9 a line (L3) designates an intensity distribution of a light with corresponding to a position in a direction of a face on the semiconductor active layer (24) (direction of right and left in the paper) at a central part of a layer direction of the semiconductor active layer (24) (vertical direction in the paper), in the meantime, a line (L4) designates an intensity distribution of a light with corresponding to a position in the layer direction of the semiconductor active layer (24) at a central part in the direction of the face on the semiconductor active layer (24).

Moreover, a component (S3) designates a component of a light that is confined in the semiconductor active layer (24) in the direction of the face. And thus in accordance with the semiconductor optical amplifier (200) which has the conventional structure the intensity of the light becomes to be strong as the maximum in the semiconductor active layer (24), and hence the rate of the component (S3) becomes to be higher. And then as a result it is difficult to reduce the confinement coefficient (Γ) to be smaller. Further, the optical loss becomes to be existed because of an optical absorption due to the semiconductor active layer (24). And then therefore it is difficult to decrease the optical loss either.

And in the meantime a component (S4) designates a component of a light that is confined in the semiconductor active layer (24) in the layer direction. And then even in the layer direction it is difficult to reduce the confinement coefficient (Γ) to be smaller, and it is difficult to decrease the optical loss either, each of which is similar to that in the direction of the face respectively.

And in the meantime a component (S5) designates a component of a light that is distributed at the cladding layer at the upper side (25a) in the layer direction. And then the cladding layer at the upper side (25a) is designed to be the (p) type that is mentioned above. However, in a case where Zn is added that is common as a dopant of the (p) type the Zn therein cannot help but absorb a light that has a wave length of such as 1.55 μm or the like. And hence it becomes to be performed an addition of the further optical loss with corresponding to a wave length of a light that is to be wave guided.

And then therefore the present invention is provided with having regard to the subjects that are described above, and then an objective is to provide a semiconductor optical amplifier from which it becomes able to obtain an output power to be higher.

Means for Solving the Problem

In order to solve the subjects that are mentioned above, and in order to complete the objective, a first aspect of a semiconductor optical amplifier in accordance with the present invention is characterized in that the semiconductor optical amplifier comprises: an active waveguide layer which comprises a passive core region that is formed of a semiconductor, and active cladding regions that are located at both sides of the passive core region and each of that is comprised of an active layer which is formed of a semiconductor and which has an index of refraction to be lower than that of the passive core region, wherein a light is wave guided with being amplified in the active waveguide layer.

Moreover, a second aspect of the semiconductor optical amplifier in accordance with the present invention is characterized in that according to the first aspect the active wave layer is formed of a compound semiconductor and is formed by integrating the passive core region and the active cladding regions to be monolithic on to a substrate that is formed of a compound semiconductor by making use of a process of a butt joint growth.

Further, a third aspect of the semiconductor optical amplifier in accordance with the present invention is characterized in that according to the first aspect the semiconductor active layer comprises a multi quantum well structure.

Still further, a fourth aspect of the semiconductor optical amplifier in accordance with the present invention is characterized in that according to the first aspect the semiconductor active layer comprises a bulk structure.

Still further, a fifth aspect of the semiconductor optical amplifier in accordance with the present invention is characterized in that according to the first aspect the passive core region is intercalated between two of cladding layers at a passive region that individually have effective indexes of refraction to be lower than that of the passive core region respectively, and then forms a slab structure of three layers.

Still further, a sixth aspect of the semiconductor optical amplifier in accordance with the present invention is characterized in that according to the first aspect the active cladding region is intercalated between two of cladding layers at an active region that individually have indexes of refraction to be lower than that of the active core region respectively, and then forms a slab structure of three layers.

Still further, a seventh aspect of the semiconductor optical amplifier in accordance with the present invention is characterized in that according to the first aspect an effective index of refraction between the passive core region and the active cladding region and a width of the passive core region in the active wave guiding layer are set up respectively, in order to perform a wave guiding of the light with a single transverse mode.

Still further, an eighth aspect of the semiconductor optical amplifier in accordance with the present invention is characterized in that according to the first aspect the semiconductor optical amplifier further comprises: a structure of an electric current injection in order to perform an injection of an electric current into the semiconductor active layer.

Still further, a ninth aspect of the semiconductor optical amplifier in accordance with the present invention is characterized in that according to the first aspect an anti-reflection coated film layer that is formed on two of end faces which is vertical or inclined against a direction for the light to be wave guided.

Furthermore, a tenth aspect of the semiconductor optical amplifier in accordance with the present invention is characterized in that according to the first aspect the semiconductor optical amplifier further comprises: a structure of an optical cavity in order to perform a laser oscillation of the light.

Effects Of The Invention

In accordance with the present invention it becomes able to reduce a confinement coefficient (Γ) to be smaller, and it becomes able to decrease an optical loss at an inner side as well. And hence it becomes able to obtain an advantage by which it becomes able to realize the semiconductor optical amplifier from which it becomes able to obtain the output power to be higher.

DESCRIPTION OF THE REFERENCE SYMBOLS

| | |
|---|---|
| 1, 21 | ELECTRODE at (n) SIDE |
| 2, 22 | SUBSTRATE |
| 3a | CLADDING LAYER at LOWER PART of PASSIVE REGION |
| 3b | CLADDING LAYER at LOWER PART of ACTIVE REGION |
| 4 | ACTIVE WAVE GUIDING LAYER |
| 4a | PASSIVE CORE REGION |
| 4b | ACTIVE CLADDING REGION |
| 4ba | SIDE WALL |
| 5a | CLADDING LAYER at UPPER PART of PASSIVE REGION |
| 5b | CLADDING LAYER at UPPER PART of ACTIVE REGION |
| 6, 27 | CONTACT LAYER |
| 7, 27 | PROTECTIVE COAT FILM LAYER |
| 8, 28 | ELECTRODE at (p) SIDE |
| 9, 29 | ELECTRODE at OUTSIDE |
| 10a, 10b | ANTI-REFLECTION COATED FILM LAYER |
| 11 | SiN FILM LAYER |
| 12, 14, 15 | RESIST |
| 13 | AuZn FILM LAYER |
| 23 | CLADDING LAYER at LOWER PART |
| 24 | SEMICONDUCTOR ACTIVE LAYER |
| 25a to 25c | CLADDING LAYER at UPPER PART |
| 30 | ELECTRIC CURRENT BLOCKING LAYER |
| 30a | ELECTRIC CURRENT BLOCKING LAYER at LOWER PART |
| 30b | ELECTRIC CURRENT BLOCKING LAYER at UPPER PART |
| 100, 200 | SEMICONDUCTOR OPTICAL AMPLIFIER |
| A | PASSIVE REGION |
| B | ACTIVE REGION |
| D | CAVITY PART |
| L1 to L4 | LINE |
| S1 to S5 | COMPONENT |

BEST MODE FOR CARRYING OUT THE INVENTION

An embodiment of a semiconductor optical amplifier in accordance with the present invention will be described in detail below, in reference to the drawings. However, the present invention is not to be limited to the embodiment. Moreover, a similar component and element or a corresponding one is to be designated properly with making use of the similar symbol in each of the drawings.

(The First Embodiment)

Figure 1:
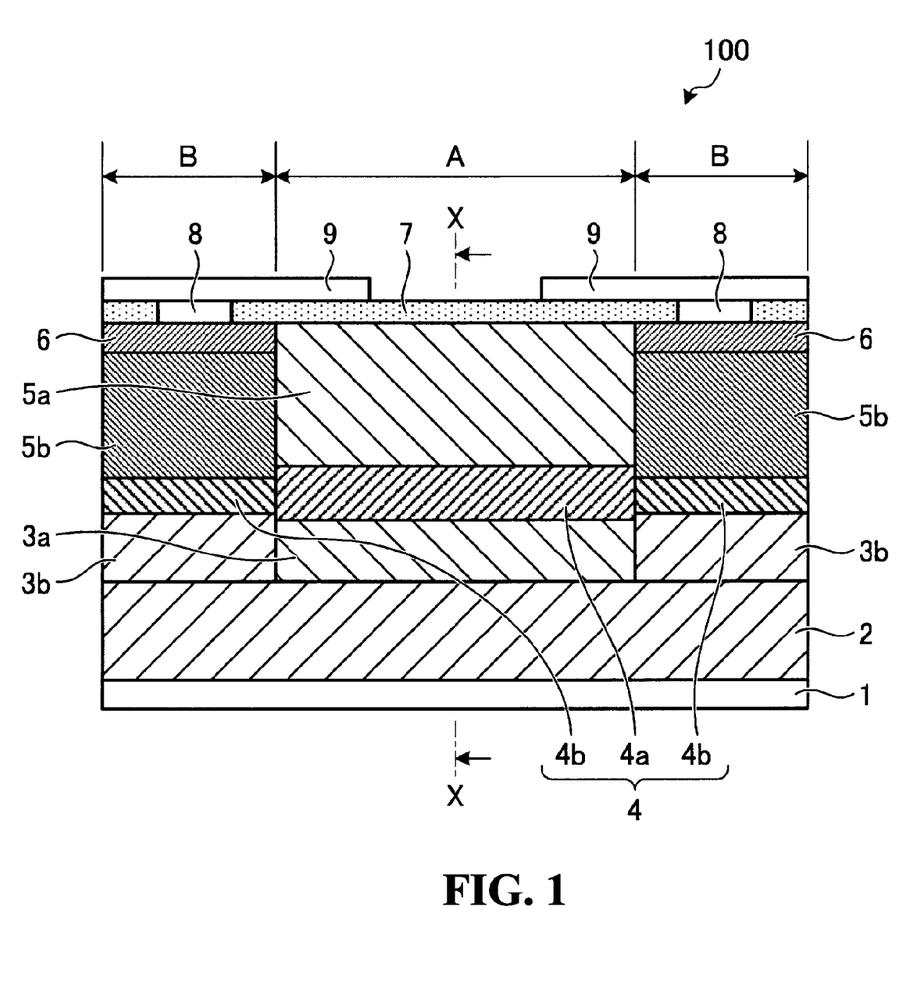
FIG. 1 is a cross sectional view exemplary showing a semiconductor optical amplifier in accordance with the first embodiment.
Figure 2:
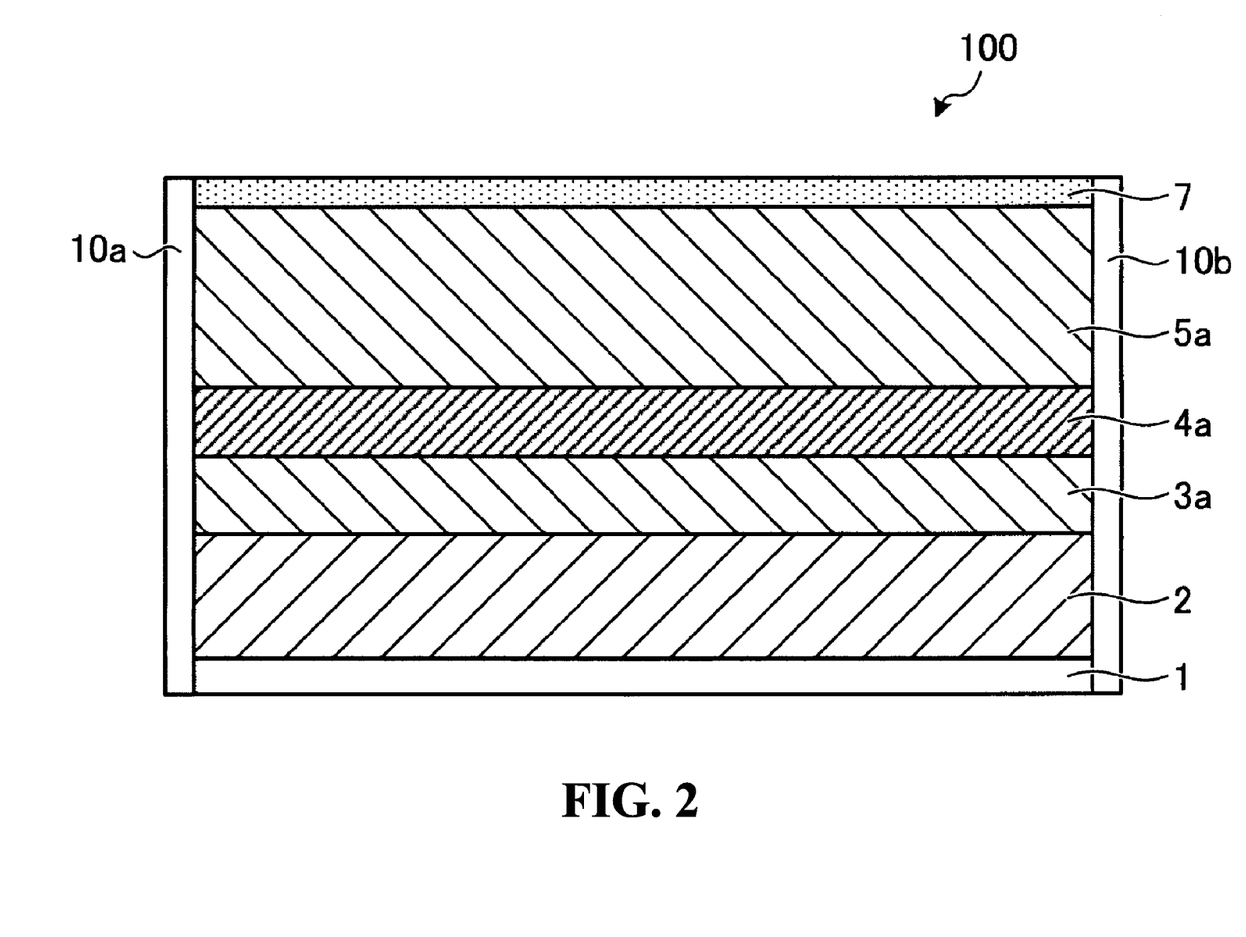
FIG. 2 is a view showing a cross section on an X-X line of the semiconductor optical amplifier that is shown in FIG. 1.

Here a semiconductor optical amplifier in accordance with the present first embodiment is designed to receive an input of a light that has a wave length in a band of 1.55 μm. Moreover, the same is designed to perform an amplification and then to output. Here, FIG. 1 is a cross sectional view for exemplary showing the semiconductor optical amplifier in accordance with the first embodiment. And FIG. 2 is a view for showing a cross section of an X-X line of such a semiconductor optical amplifier (100) that is shown in FIG. 1. And then the semiconductor optical amplifier (100) comprises an active wave guiding layer (4) in order to perform the wave guiding with perform the amplification of the light on to a substrate (2) as an (n) type on which an electrode at an (n) side (1) is formed at a rear surface, that are shown in FIG. 1 and FIG. 2. Further, the active wave guiding layer (4) comprises a passive core region (4a) and active cladding regions of (4b) and another (4b) that are individually positioned at each side of the passive core region (4a) and each of that is comprised of an active layer which is formed of a semiconductor and which has an index of refraction to be lower with comparing to that of the passive core region (4a).

Still further, the passive core region (4a) is intercalated between a cladding layer at a lower part of a passive region (3a) and a cladding layer at an upper part of a passive region (5a), each of that is formed on to the substrate (2) respectively. Still further, each of the cladding layer at the lower part of the passive region (3a) and the cladding layer at the upper part of the passive region (5a) has an index of refraction to be lower with comparing to that of the passive core region (4a). And then therefore the passive core region (4a) forms a slab structure of three layers with making use of the cladding layer at the lower part of the passive region (3a) and of the cladding layer at the upper part of the passive region (5a). Hereinafter a region that the slab structure is formed therein is defined as a passive region (A).

And in the meantime, each of the active cladding regions (4b) is intercalated between a cladding layer at a lower part of an active region (3b) and a cladding layer at an upper part of an active region (5b), each of that is formed on to the substrate (2) respectively. Still further, each of the cladding layer at the lower part of the active region (3b) and the cladding layer at the upper part of the active region (5b) has an index of refraction to be lower with comparing to that of each of the active cladding regions (4b) respectively. And then therefore each of the active cladding regions (4b) forms a slab structure of three layers respectively, with making use of each of the cladding layers at the lower part of the active region (3b) and each of the cladding layers at the upper part of the active region (5b). Hereinafter a region that each of the slab structures is formed therein is defined as an active region (B) and another (B), respectively.

Still further, the semiconductor optical amplifier (100) further comprises contact layers (6) and another (6) on to each of the cladding layers at the upper side of the active region (5b) respectively. Still further, the semiconductor optical amplifier (100) further comprises: a protective coated film layer (7) that is formed on to all over the cladding layer at the upper part of the passive region (5a) and each of the contact layers (6); electrodes at a (p) side as (8) and another (8) that are individually formed at each of open part of the protective coated film layer (7) that positions on each of the contact layers (6); and electrodes at an outside as (9) and another (9) that are individually formed on to the protective coated film layer (7) so as to contact to each of the electrodes at the (p) side as the (8), respectively.

Still further, in accordance with the semiconductor optical amplifier (100) two of end faces are formed as vertical to a direction for a light to be wave guided, that is shown in FIG. 2. And then at the two of the end faces each of anti-reflection coated film layers (10a) and (10b) is formed respectively. And then thereby becoming the coefficient of reflection to be decreased as lower than or equal to −30 dB. Still further, it may be available for the two of the end faces to be inclined approximately between five degrees and ten degrees against the direction for the light to be wave guided so as to perform an improvement of the advantage of the anti-reflection.

Still further, the electrode at the (n) side (1) comprises a structure of an AuGeNi/Au. Still further, the substrate (2) is formed of an n-InP. Still further, the passive core region (4a) in the active wave guiding layer (4) is formed of an InGaAsP that is an intrinsic semiconductor in which any impurity is not added at all and that has 1.15Q. Still further, each of the cladding layer at the lower part of the passive region (3a) and the cladding layer at the upper part of the passive region (5a) is formed of an InP as an undope respectively. Still further, a layer thickness of the passive core region (4a) is defined here to be approximately 0.322 µm. Here, the 1.15Q means that a wave length of a band gap is approximately 1.15 µm. And then therefore each of the passive core region (4a) and the cladding layer at the lower part of the passive region (3a) and the cladding layer at the upper part of the passive region (5a) is not to absorb any light that has the wave length of approximately 1.15 µm, respectively.

Still further, the active cladding region (4b) in the active wave guiding layer (4) is formed of an InGaAsP, and then the same is comprised of an active layer as a multi quantum well (MQW) separate confinement heterostructure (SCH) in which the SCH as three stages is formed at both sides of the MQW structure. Still further, the MQW is designed to have a structure in which wells with having a layer thickness for each to be approximately six nanometers and barrier layers with having a layer thickness for each to be ten nanometers are grown as six layers for each. Still further, the cladding layer at the lower part of the active region (3b) is formed of an n-InP in which Se is added with a concentration of approximately one times $10^{18}$ cm$^{-3}$. Still further, the cladding layer at the upper part of the active region (5b) is formed of a p-InP in which Zn is added with a concentration of approximately one times $10^{18}$ cm$^{-3}$. Still further, the contact layer (6) is formed of a p-InP in which Zn is added with a concentration of approximately one times $10^{18}$ cm$^{-3}$ in order to obtain an ohmic contact.

Still further, in accordance with the slab structure of the passive region (A), as defining the effective index of refraction of the passive core region (4a) to be n(core) the n(core) is determined here to be approximately 3.20303. Still further, in accordance with the slab structure of each of the active regions (B), as defining the effective index of refraction of each of the active cladding region (4b) to be n(clad) the n(clad) is determined here to be approximately 3.20052. And then therefore the n(core) is determined to be larger than the n(clad). And hence it becomes able to realize the structure of the wave guide, in which the passive core region (4a) is designed to be the core in accordance with the active wave guiding layer (4). Still further, as defining the width of the mesa of the passive core region (4a) to be (W) the (W) is equal to 4.2 µm. And then therefore it becomes able to perform the wave guiding of the light that has the wave length of 1.55 µm with the single mode by making use of the active wave guiding layer (4).

Still further, it is necessary to set up a (V) value to be smaller than or equal to π/2, that is defined by the following (Formula 1) with assuming a wave length of a light as (λ) that is to be wave guided, in order to satisfy a condition for the light to be wave guided as the single mode.

$$V = \frac{2\pi}{\lambda}\left(\frac{W}{2}\right)\sqrt{n_{core}^2 - n_{clad}^2}.$$ (Formula 1)

And then by the (Formula 1) the (V) value becomes to be smaller than or equal to it π/2 that is defined by the (Formula 1) if the (W) is smaller than or equal to six micrometers for the semiconductor optical amplifier in accordance with the present first embodiment. And thus it becomes able to satisfy the condition of the wave guiding with the single mode at the wave length of 1.55 µm.

Still further, the protective coated film layer (7) is formed of an SiNx. Still further, the electrode at the (p) side (8) is formed of an AuZn, and then the same has a size to be such as 2.1 µm times 2000 µm or the like. Still further, the electrode at the outside (9) comprises a structure of a Ti/Pt. Still further, each of the anti-reflection coated film layers as the (10a) and the (10b) comprises a structure of an $Al_2O_3$/a-Si/$Al_2O_3$ that individually have the layer thickness of 30 nm/24 nm/230 nm respectively.

Furthermore, it becomes able to realize the structure for performing the injection of the electric current into the active cladding region (4b), by configuring the electrode at the (n) side (1), the substrate (2), the cladding layer at the lower part of the active layer (3b), the cladding layer at the upper part of the active layer (5b), the contact layer (6), the protective coated film layer (7), the electrode at the (p) side (8) and the electrode at the outside (9) that are described above.

And then the semiconductor optical amplifier (100) becomes to function as the following. In the first instance, a voltage is applied between the electrode at the (n) side (1) and the electrodes at the (p) side (8) and the other (8), and then an electric current is injected into the active cladding regions (4b) and the other (4b) in the active region (B) and the other (B) for the active cladding regions (4b) and the other (4b) to be an excited state respectively. And then after the active cladding regions (4b) and the other (4b) becoming the excited state in such a manner a light that has a wave length in the band of 1.55 µm is input from such as the anti-reflection coated film layer (10b) side or the like. And hence the light becomes to be confined mainly in the passive core region (4a) and then to be wave guided by making use of the active wave guiding layer (4). Moreover, the light becomes to be amplified by making use of the active cladding region (4b) and the other (4b). And then as a result a light that is amplified becomes to be output from the anti-reflection coated film layer (10a) side.

Figure 3:
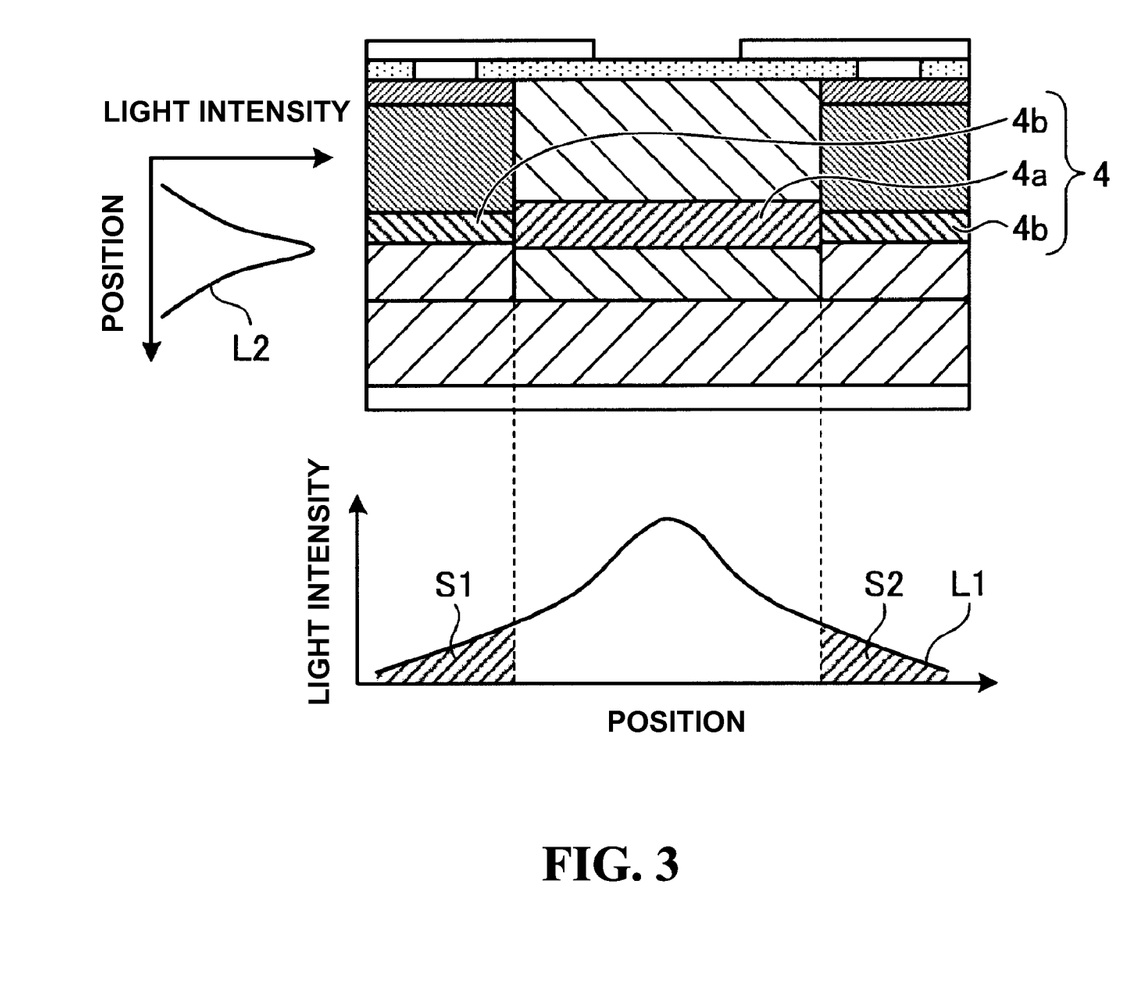
FIG. 3 is a view exemplary showing an intensity distribution of a light that is wave guided in the semiconductor optical amplifier which is shown in FIG. 1.

Next, a function of the optical amplification of the semiconductor optical amplifier (100) will be further described in detail below. Here, FIG. 3 is a view for exemplary showing an intensity distribution of a light that is wave guided in the semiconductor optical amplifier (100) which is shown in FIG. 1. And then in accordance with FIG. 3 a line (L1) designates an intensity distribution of a light with corresponding to a position in a direction of a face on the active wave guiding layer (4) at a central part of a layer direction of the active wave guiding layer (4), in the meantime, a line (L2) designates an intensity distribution of a light with corresponding to a position in the layer direction of the active wave guiding layer (4) at a central part in the direction of the face on the active wave guiding layer (4).

And then as it is obvious in accordance with FIG. 3, the position of which the intensity of the light has the maximum is in the passive core region (4a) by which any of the light is not to be absorbed, that is designated by making use of the line (L1) in the direction of the face on the active wave guiding layer (4). And then a component of the light becomes to be components as (S1) and (S2) each of which has an intensity of the light to be week respectively, that is distributed in the active cladding region (4b) which is comprised of the semiconductor active layer. And in the meantime an intensity distribution of the light that is designated by making use of the line (L2) is not to be distributed at all in the active cladding region (4b). And then therefore in accordance with the semiconductor optical amplifier (100) it becomes able to reduce the confinement coefficient (Γ) to be smaller, and it becomes able to decrease the optical loss as well that is to be occurred because of the optical absorption due to the semiconductor active layer.

Moreover, any optical absorption due to a dopant is not existed at all because the cladding layer at the upper part of the passive region (5a) is undoped. And hence it becomes able to prevent the optical loss from increasing. Further, in each of the active regions (B) the light that is distributed in each of the cladding layers at the upper part of the active region (5b) is received a negative effect of the optical absorption due to the Zn that is added therein, respectively. In the meantime however, the intensity of the light is week from the beginning in each of the active region (B) that is shown in the intensity distribution of the light by making use of the line (L1), respectively. And hence the intensity of the light that is distributed in each of the cladding layers at the upper part of the active region (5b) becomes to be week either. And then therefore the negative affect due to the optical absorption becomes to be extremely smaller.

And thus as described above in accordance with the semiconductor optical amplifier (100) it becomes able to reduce the coefficient of the confinement (Γ) to be smaller, and it becomes able to decrease the optical loss as well that is to be occurred because of the optical absorption due to the semiconductor active layer. Still further, it becomes able to prevent the optical loss from the increase as well, that is to be occurred because of the optical absorption due to the Zn therein. And then as a result, it becomes able to obtain the semiconductor optical amplifier (100) as the semiconductor optical amplifier that becomes to have an output power to be extremely higher with comparing to that of the conventional type. Furthermore, it becomes able to realize the reduction of the noise to be lower because of the reduction of the optical loss in the optical amplifier. And then as a result, it becomes able to obtain the semiconductor optical amplifier (100) as the semiconductor optical amplifier by which it becomes able to perform the reduction of the noise to be extremely lower with comparing to that of the conventional type.

Figure 4:
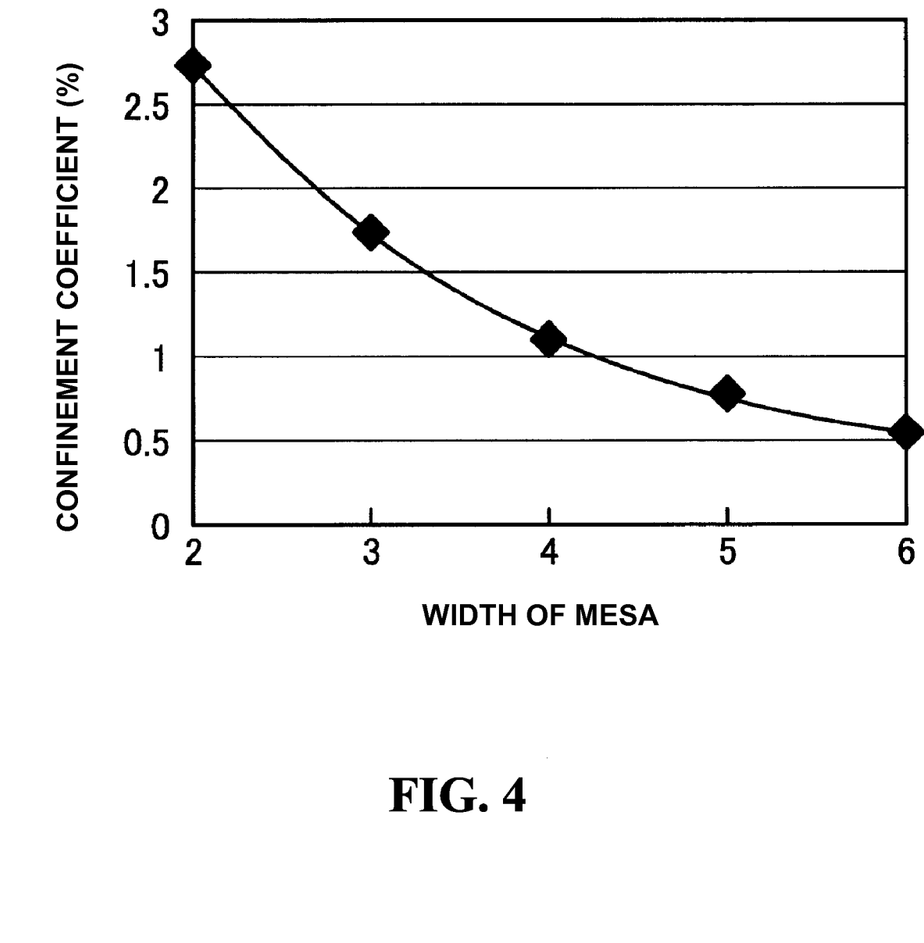
FIG. 4 is a view showing a relation between a width of a mesa (W) in a passive core region and a confinement coefficient (Γ) in accordance with the semiconductor optical amplifier that is shown in FIG. 1.

Here, FIG. 4 is a view for showing a relation between the width of the mesa (W) in the passive core region (4a) and the confinement coefficient (Γ) in accordance with the semiconductor optical amplifier (100) that is shown in FIG. 1. And then as showing in FIG. 4, as widening the width of the mesa (W) to be wider, the confinement coefficient (Γ) has a tendency that the same becomes to be decreasing. And then the (Γ) becomes to be one percent for the (W) that is equal to 4.2 μm. Moreover, it is able to determine properly regarding the confinement coefficient (Γ) with taking into consideration of such as a specification of the output power of the light or the like. Further, in a case of realizing a predetermined output power of the light, and then in a case where the confinement coefficient (Γ) is designed to be smaller an operating electric current becomes to be higher that corresponds to the coefficient. And then therefore it is able to determine properly a lower limit of the confinement coefficient (Γ) with taking into consideration of such as a specification of an electric power consumption or the like as well.

(Process of Manufacturing)

Figure 5A:
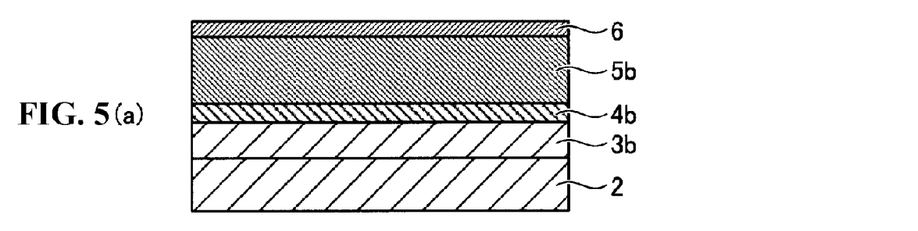
FIGS. 5A-D are drawings showing one example of a process of manufacturing the semiconductor optical amplifier that is shown in FIG. 1.

Next, one example of a process of manufacturing the semiconductor optical amplifier (100) that is shown in FIG. 1 will be described in detail below. Here, from FIG. 5 through FIG. 7 are drawings for showing the one example of the process of manufacturing the semiconductor optical amplifier (100) that is shown in FIG. 1. And in the first instance the cladding layer at the lower part of the active region (3b), the active cladding layer (4b), the cladding layer at the upper part of the active region (5b) and the contact layer (6) are to be formed on to whole face on the substrate (2) by making use of an equipment for a crystal growth using a metal organic chemical vapor deposition (MOCVD) or using a molecular beam epitaxy (MBE) with setting up a temperature for the growth to be approximately 600° C., that are shown in FIG. 5(a). Moreover, the cladding layer at the lower part of the active region (3b) functions as the buffer layer.

Figure 5B:
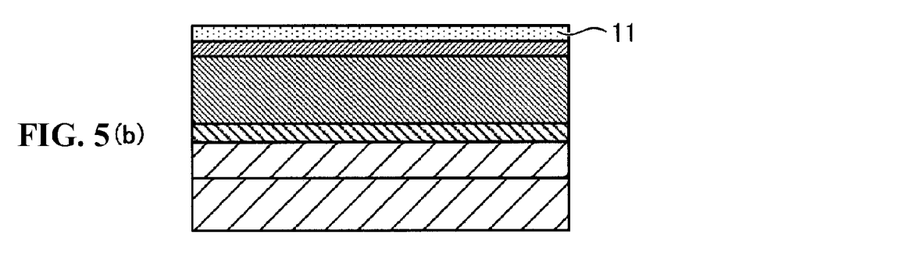
Figure 5C:
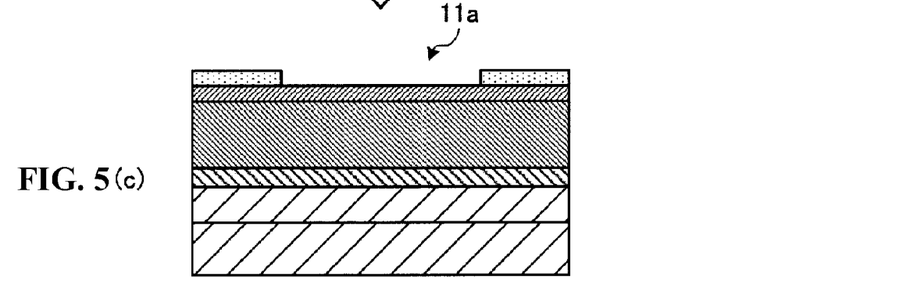
Figure 5D:
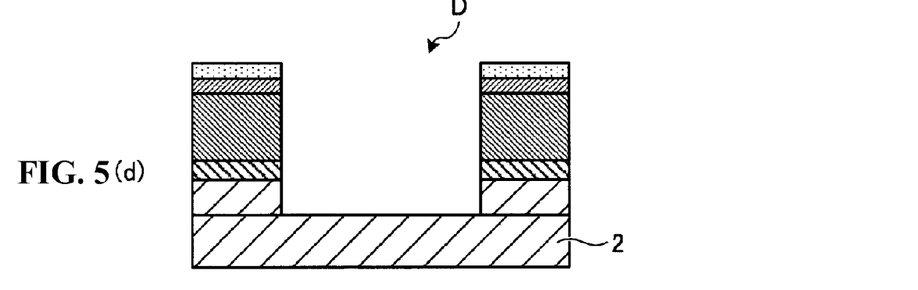

Next, an SiN film layer (11) is to be formed on to the contact layer (6), that is shown in FIG. 5(b). Next, an etching is performed in order to remove the SiN film layer (11) at a region of which the passive region (A) is to be formed, that is shown in FIG. 5(c), in the meantime, in order to remain the SiN film layer (11) at a region of which the active region (B) is to be formed. Moreover, the contact layer (6), the cladding layer at the upper part of the active region (5b), the active cladding region (4b) and the cladding layer at the lower part of the active region (3b) are to be removed by performing a dry etching with making use of the SiN film layer that is remained to be as a mask and with making use of a gas of a chloride system or of a methane hydride system, that are shown in FIG. 5(d). And then as a result, a surface of the substrate (2) becomes to be exposed at a cavity part (D) for which a semiconductor layer is removed by performing the dry etching.

Figure 6A:
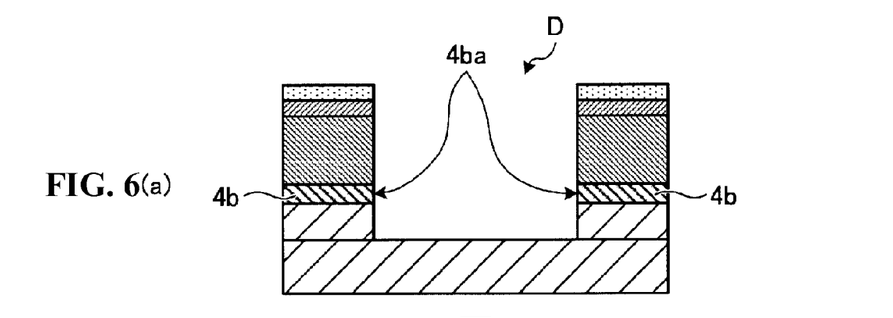
FIGS. 6A-D are drawings showing the one example of the process of manufacturing the semiconductor optical amplifier that is shown in FIG. 1.
Figure 6B:
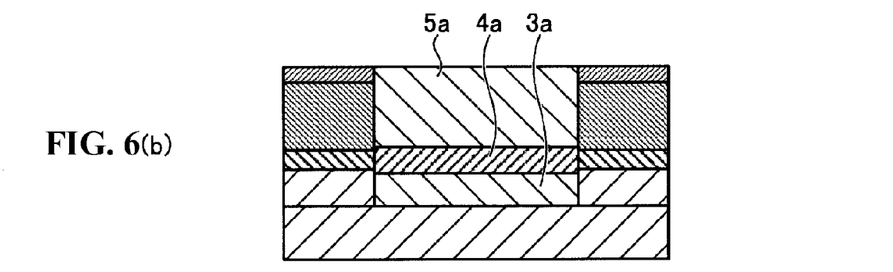

Next, an inner side of the cavity part (D) is to be processed for a wet etching, that is shown in FIG. 6(a), in order to remove a damaged layer that is to be generated at a side wall (4ba) of the active cladding region (4b) due to the processing of the dry etching. Next, the cladding layer at the lower part of the passive region (3a), the passive core region (4a) and the cladding layer at the upper part of the passive region (5a) are to be formed at the cavity part (D) by making use of the process of the butt joint growth with making use of the equipment for the crystal growth using the MOCVD or using the MBE, that are shown in FIG. 6(b). And then by making use of the process of the butt joint growth in such a manner it becomes able to realize easily the formation of the passive core region (4a) and the active cladding region (4b) with being integrated monolithically on to the substrate (2).

Figure 6C:
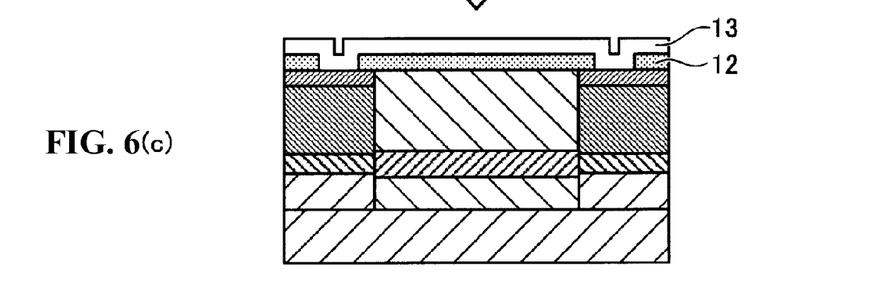
Figure 6D:
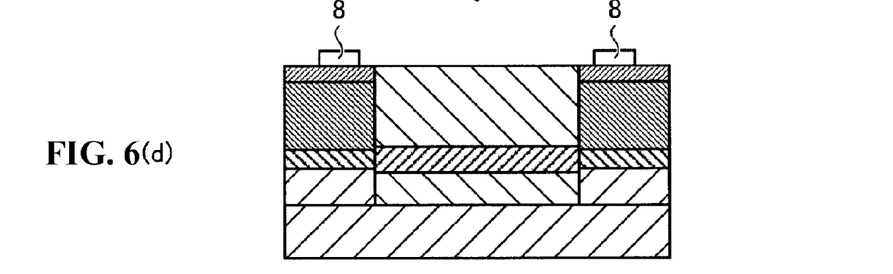

Next, a resist (12) is to be formed on to all of the faces, and then thereafter a part that corresponds to the electrodes at the (p) side as the (8) and the other (8) is to be processed for a patterning by making use of a photolithography, and then thereafter an AuZn film layer (13) is to be formed by performing an evaporation, that are shown in FIG. 6(C). Next, the resist (12) is to be removed, and then the electrodes at the (p) side as the (8) and the other (8) are to be formed by performing a lift off process, that are shown in FIG. 6(d).

Figure 7A:
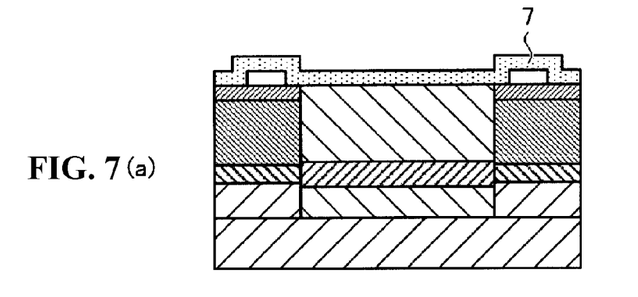
FIGS. 7A-D are drawings showing the one example of the process of manufacturing the semiconductor optical amplifier that is shown in FIG. 1.
Figure 7B:
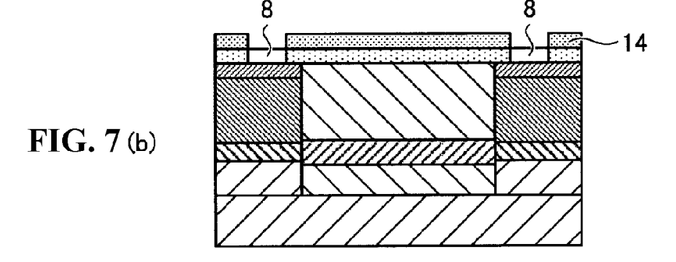
Figure 7C:
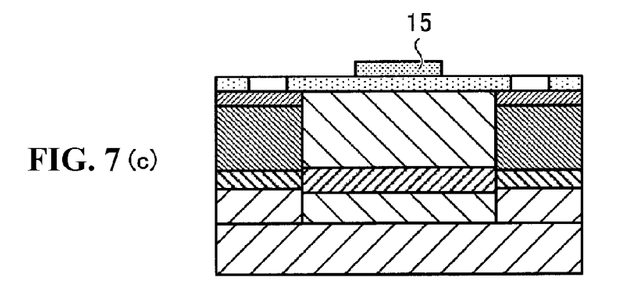
Figure 7D:
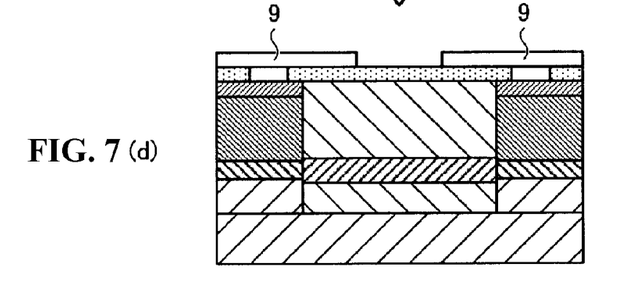

Next, the protective coated film layer (7) is to be formed on to all of the faces by performing the evaporation, which becomes to have a layer thickness of approximately 120 nm and which is to be formed of the SiNx, that is shown in FIG. 7(a). Next, a resist (14) is to be formed, and then thereafter a window is to be opened at a region that contacts to each of the electrodes at the (p) side as the (8) and the other (8) by making use of the process of the photolithography, and then thereafter the protective coated film layer (7) at the region that contacts to each of the electrodes at the (p) side as the (8) is to be removed by making use of a process of a reactive ion etching (RIE), that are shown in FIG. 7(b). And then thereafter the resist (14) is to be removed. Next, a resist is to be formed on to all of the faces, and then thereafter a part that corresponds to the electrode at the outside (9) is to be processed by performing a patterning by making use of the process of the photolithography, and then the part becomes to be a resist (15), that are shown in FIG. 7(c). Next, a film layer of a Ti/Pt is to be formed by performing the evaporation, and then thereafter each of the electrodes at the outside as the (9) and the other (9) is to be formed by making use of the lift off process, that are shown in FIG. 7(d).

And then thereafter a rear surface of the substrate is to be processed for polishing. Next, a film layer of an AuGeNi/Au is to be formed on to the rear surface that is polished by performing the evaporation in order to form the electrode at the (n) side, and then thereafter the substrate is to be processed for annealing at a temperature of approximately 430° C. And then thereafter the end face is to be formed by performing a cleaving. Next, each of the anti-reflection coated film layers as the (10a) and the (10b) is to be formed on to the end face, and then thereafter the substrate is to be separated into each of the devices. And thus the semiconductor optical amplifier (100) becomes to be completed.

Next, the characteristic of the semiconductor optical amplifier (100) in accordance with the present first embodiment that is shown in FIG. 1 is to be compared to that of the conventional semiconductor optical amplifier (200) which is shown in FIG. 7, by making use of a calculation result of a simulation.

Here the semiconductor optical amplifier (200) is assumed to comprise the following. In the first instance, the semiconductor active layer (24) is assumed to be formed of the InGaAsP, which is similar to that for the active cladding region (4b) in the semiconductor optical amplifier (100), and then the same is to be the active layer of the MQW-SCH which is comprised of: the MQW as the six layers in which each of the wells has the layer thickness of six nanometers and each of the barrier layers has the layer thickness of ten nanometers; and the SCH as the three stages at the both sides thereof. Moreover, a width of the semiconductor active layer (24) is assumed here to be 4.2 µm. Further, the confinement coefficient (Γ) is assumed here to be five percent that is so far realized. Still further, a difference of the index of refraction between the semiconductor active layer (24) and each of the layers that surrounds the semiconductor active layer (24) is set up for the coefficient of the confinement coefficient (Γ) so as to be the value that is mentioned above. Still further, Zn is assumed here to be added into each of the cladding layers at the upper part from the (25a) through the (25c) with the concentration of approximately one times $10^{18}$ cm$^{-3}$.

Furthermore, a gain length of each of the semiconductor optical amplifiers, that is to say, a length of the active cladding region (4b) and a length of the semiconductor active layer (24) in the direction for the light to be wave guided is assumed here to be two millimeters respectively.

And then in accordance with the semiconductor optical amplifier (200) a rate of the light that is leaked out to each of the cladding layers at the upper part from the (25a) through the (25c) in which the Zn is added is evaluated to be approximately 41.6%. On the contrary however, in accordance with the semiconductor optical amplifier (100) a rate of the light that is leaked out to each of the cladding layers at the upper part of the active region as the (5b) and the other (5b) in which the Zn is added is evaluated to be approximately 10.5%, that becomes to be smaller as approximately one fourth as the case of the semiconductor optical amplifier (200).

Here, the rate of the light that is leaked out to the layer in which the Zn is added and the optical loss because of the optical absorption due to the Zn has a relationship in proportion approximately. And then therefore it is able to reduce the optical loss due to the Zn in accordance with the semiconductor optical amplifier (100) to be as approximately one fourth as that of the semiconductor optical amplifier (200). And then it is able to perform an estimation of the optical loss to be approximately four cm$^{-1}$ in accordance with the semiconductor optical amplifier (100) if the optical loss due to the absorption by the Zn in accordance with the semiconductor optical amplifier (200) is assumed to be sixteen cm$^{-1}$.

And then under the conditions that are described above a calculation is performed for the characteristic of the optical amplification, in a case where an electric current that is to be injected into each of the semiconductor optical amplifiers is assumed as 2100 mA, and a light is input, that is assumed to have a wave length of 1.55 µm, and that is assumed to have a light intensity as zero dBm. And then as a result, the output power of the light in accordance with the semiconductor optical amplifier (200) is evaluated to be 21.02 dBm, and the NF is evaluated to be 5.161 dB. On the contrary however, the output power of the light in accordance with the semiconductor optical amplifier (100) is evaluated to be 25.32 dBm, and the NF is evaluated to be 3.361 dB. That is to say, in accordance with the semiconductor optical amplifier (100) it becomes able to obtain the output power to be higher as 4.3 dB as that in accordance with the semiconductor optical amplifier (200), and it becomes able to reduce the noise as well in accordance with the semiconductor optical amplifier (100), that is lower with an extreme amount of 1.8 dB.

Here, in the semiconductor optical amplifier (100) in accordance with the first embodiment that is described above the semiconductor active layer at the active cladding region (4b) comprises the MQW structure. However, it is able to set up properly such as the number of the well layers or the layer thickness or the like of the MQW structure. Moreover, it may be available for the semiconductor active layer to comprise a bulk structure as well. And then in accordance with the semiconductor optical amplifier that has the conventional structure it is extremely difficult to design the confinement coefficient (Γ) to be smaller as close to one percent in a case where the semiconductor active layer is formed into the bulk structure. On the contrary however, by making use of the semiconductor optical amplifier in accordance with the present invention it becomes able to realize easily the confinement coefficient (Γ) to be close to one percent or even lower than such a value.

Further, in the semiconductor optical amplifier (100) in accordance with the first embodiment that is described above such as the materials for each of such as the compound semiconductors and for each of the electrodes and the like or each of the dimensions or the like are set up in order to perform the wave guiding of the light as the single mode with performing the amplification, that has the wave length in the band of 1.55 µm. However, it is able to set up properly such as each of the materials or each of the dimensions or the like with corresponding to a wave length or a wave guided mode of a light for which an amplification is desired to be performed.

Still further, in the semiconductor optical amplifier (100) in accordance with the first embodiment that is described above the semiconductor active layer at the active cladding region (4b) is excited state by making use of the structure of the electric current injection. However, it may be available to perform an excitation by making use of an exciting light as well.

Still further, in the semiconductor optical amplifier (100) in accordance with the first embodiment that is described above the slab structure as the three layers is formed with making use of the passive region (A) and the active regions as the (B) and the other (B). However, it is not to be limited in particular thereto if it is designed to have a structure by which it is able to perform the wave guiding of the light with performing the amplification in the active wave guiding layer (4).

Still further, the semiconductor optical amplifier (100) in accordance with the first embodiment that is described above is designed to function as the optical amplifier. However, in accordance with the semiconductor optical amplifier (100) each of the end faces become to have a predetermined coefficient of reflection in a case where the anti-reflection coated film layers as the (10a) and the (10b) are not to be formed. And then by forming an optical amplifier with making use of the two of the end faces, and also by designing for a light that is wave guided with being amplified so as to perform a laser oscillation it becomes able to make use of the device as a semiconductor laser equipment. Still further, it becomes able to make use of the semiconductor optical amplifier (100) as the semiconductor laser equipment in the same way even in a case where a reflection coated film layer is formed that has a desired coefficient of reflection in the place of each of the anti-reflection coated film layers as the (10a) and the (10b). And hence in accordance with the semiconductor laser equipment it becomes able to reduce the confinement (Γ) to be smaller, and it becomes able to decrease an optical loss at an inner side as well. And then therefore it becomes able to obtain the semiconductor laser equipment from which it becomes able to obtain the output power to be higher and it becomes able to obtain a threshold value to be smaller.

Furthermore, it becomes able to arrange the semiconductor optical amplifiers in accordance with the present invention in an array form, and then thereby becoming able to make use of the same as a semiconductor optical amplification array device as well. And then it becomes able to make use of the semiconductor optical amplification array device as preferred, with a combination of the fine optical circuit that has a multi-channel function, such as the AWG or the like in particular.

What is claimed is:

1. A semiconductor optical amplifier, comprising:
    an active wave guiding layer which comprises a passive core region that is formed of a semiconductor, and active cladding regions that each comprise an active layer which is formed of a semiconductor and which has an index of refraction to be lower than an index of refraction of said passive core region,
    wherein said passive core region is intercalated between two cladding layers of a passive region to form a slab structure of three layers that forms the passive region, wherein the two cladding layers of the passive region individually have indexes of refraction lower than the index of refraction of said passive core region,
    wherein said active cladding regions are each intercalated between two cladding layers of an active region to form a slab structure of three layers that forms the active region, wherein the two cladding layers of the active region individually have indexes of refraction lower than the indexes of refraction of each of said active cladding regions,
    wherein said active regions comprise a first active region and a second active region, and said active regions are oriented according to the first active region being adjacent to the passive region at a first end of the passive region and the second active region being adjacent to the second active region at a second end of the passive region,
    wherein both ends of said passive core region are connected with one end of one of said active cladding regions,
    wherein a light is wave guided and amplified in said active wave guiding layer, and
    wherein an intensity distribution of the light corresponding to a position in a layer direction of the active wave guiding layer at a central part in the direction of the face on the active wave guiding layer is not substantially distributed in the active cladding regions.

2. The semiconductor optical amplifier according to claim 1,
    wherein said active wave guiding layer is formed of a compound semiconductor and is formed by integrating said passive core region and said active cladding regions to be monolithic on to a substrate that is formed of a compound semiconductor by making use of a process of a butt joint growth.

3. The semiconductor optical amplifier according to claim 1, wherein said active layer comprises a multi quantum well structure.

4. The semiconductor optical amplifier according to claim 1,
    wherein said active layer comprises a bulk structure.

5. The semiconductor optical amplifier according to claim 1,
    wherein an effective index of refraction between said passive core region and said active cladding region and a width of said passive core region in said active wave guiding layer are set up respectively, in order to perform a wave guiding of said light with a single transverse mode.

6. The semiconductor optical amplifier according to claim 1, further comprising:
    a structure of an electric current injection in order to perform an injection of an electric current into said active layer.

7. The semiconductor optical amplifier according to claim 1, further comprising:
    an anti-reflection coated film layer that is formed on two of end faces which is vertical or inclined against a direction for said light to be wave guided.

8. The semiconductor optical amplifier according to claim 1, further comprising:
    a structure of an optical cavity in order to perform a laser oscillation of said light.

* * * * *